(12) United States Patent
Nishijima et al.

(10) Patent No.: US 11,121,013 B2
(45) Date of Patent: Sep. 14, 2021

(54) SEMICONDUCTOR WAFER CONTAINER

(71) Applicant: Achilles Corporation, Tokyo (JP)

(72) Inventors: Masayuki Nishijima, Tokyo (JP); Kenichi Hirose, Tokyo (JP); James Christie, Eagle Mountain, UT (US)

(73) Assignee: ACHILLES CORPORATION, Tokyo (JP)

( * ) Notice: Subject to any disclaimer, the term of this patent is extended or adjusted under 35 U.S.C. 154(b) by 161 days.

(21) Appl. No.: 16/498,450

(22) PCT Filed: Feb. 6, 2018

(86) PCT No.: PCT/JP2018/004019
§ 371 (c)(1),
(2) Date: Sep. 27, 2019

(87) PCT Pub. No.: WO2018/179859
PCT Pub. Date: Oct. 4, 2018

(65) Prior Publication Data
US 2021/0118712 A1    Apr. 22, 2021

(30) Foreign Application Priority Data
Mar. 31, 2017   (JP) .............................. JP2017-071320

(51) Int. Cl.
H01L 21/673    (2006.01)
(52) U.S. Cl.
CPC .... H01L 21/67369 (2013.01); H01L 21/6732 (2013.01); H01L 21/67353 (2013.01)

(58) Field of Classification Search
CPC .......... H01L 21/67369; H01L 21/6732; H01L 21/67353; H01L 21/673
(Continued)

(56) References Cited

U.S. PATENT DOCUMENTS 4,511,038 A *   4/1985   Miller ................... B65D 85/48
                                                          206/454
6,837,374 B2 *  1/2005   Nigg ................. H01L 21/67346
                                                          206/454
(Continued)

FOREIGN PATENT DOCUMENTS

| JP | 2002/002695 A | 1/2002 |
|----|---------------|--------|
| JP | 2003/168731 A | 6/2003 |

(Continued)

Primary Examiner — Steven A. Reynolds
(74) Attorney, Agent, or Firm — Porter Wright Morris & Arthur LLP

(57) ABSTRACT

A semiconductor wafer container includes two outer shells in a substantially flat and identical form. Each outer shell vertically overlaps so as to accommodate a single semiconductor wafer therein. Each outer shell has a main body, a wafer retaining device and an external wall forming device. The wafer retaining device accommodates and fixedly holds the wafer in such a manner that upper and bottom surfaces of the wafer are not substantially in contact with the outer shells. The wafer retaining device includes: an inclined surface; a wafer contact surface; and a shallow gap portion. The external wall forming device has a hanging portion formed on an outer peripheral edge of the bottom surface of the outer shell so as to externally constitute a closed external wall relative to the wafer when each outer shell vertically overlaps to store the wafer.

4 Claims, 7 Drawing Sheets

(58) Field of Classification Search
USPC .................................................. 206/710, 454
See application file for complete search history.

(56) References Cited

U.S. PATENT DOCUMENTS

| | | | | |
|---|---|---|---|---|
| 7,530,462 | B2* | 5/2009 | Yajima | H01L 21/67346 |
| | | | | 206/303 |
| 7,588,150 | B2* | 9/2009 | Kasama | H01L 21/67346 |
| | | | | 206/303 |
| 7,624,870 | B2* | 12/2009 | Nishizaka | H01L 21/67353 |
| | | | | 206/303 |
| 7,819,252 | B2* | 10/2010 | Kasama | H01L 21/67346 |
| | | | | 206/710 |
| 8,863,956 | B2* | 10/2014 | Brooks | H01L 21/67369 |
| | | | | 206/710 |
| 9,666,468 | B2* | 5/2017 | Nishijima | H01L 21/67346 |
| 10,643,876 | B2* | 5/2020 | Schober | H01L 21/67389 |
| 2009/0297303 | A1* | 12/2009 | Hyobu | H01L 21/67778 |
| | | | | 414/269 |
| 2011/0180451 | A1* | 7/2011 | Pylant | H01L 21/67369 |
| | | | | 206/592 |
| 2015/0380293 | A1* | 12/2015 | Nishijima | H01L 21/6836 |
| | | | | 206/710 |

FOREIGN PATENT DOCUMENTS

| | | |
|---|---|---|
| JP | 2009/105116 A | 5/2009 |
| WO | 2004/087535 A1 | 6/2006 |

* cited by examiner

7-A

7-B

SEMICONDUCTOR WAFER CONTAINER

FIELD OF THE INVENTION

The present invention relates to a semiconductor wafer container formed by vertically overlapping two substantially flat and identical outer shells, which can accommodate a wafer in the manner that the upper and the bottom surfaces of the wafer do not substantially make contact with the outer shells.

BACKGROUND ART

When transporting a semiconductor wafer to conduct a process such as test packaging, a coin-stack type (horizontally placed) transfer container that stacks a plurality of wafers and a vertically-placed transfer container that forms a plurality of support grooves for vertically supporting the peripheral portion of the wafer are commonly used.

However, when just developing semiconductor wafers and starting the manufacture of the wafers, in order to meet specifications or required performance of various finished products, the wafers need to be manufactured in small lots. Hence, an individual container (a single shipper) that stores only one wafer is often used.

As the individual container for wafers used for such purposes, the ones designed so as not to need to distinguish a bottom portion and a lid portion have been proposed (see, for example, Patent Document 1).

An individual container described in Patent Document 1 is a container that enables to properly use a pair of outer shells for a bottom portion and a lid portion, and store a semiconductor wafer by holding it between a pair of sheets in that each opening of the pair of outer shells faces each other.

In the specification of Patent Document 1, each plate surface of the outer shells is provided with an inner rising portion that internally forms a storage space for the wafer and an outer rising portion of the container around the inner rising portion. Patent Document 1 states that this structure forms a space for shock absorption and protects the wafer from shocks applied to the container.

PRIOR ART DOCUMENT

Patent Document

Patent Document 1: Re-Publication of PCT International Publication No. WO2004/087535

SUMMARY OF THE INVENTION

Problems to be Solved by the Invention

The container described in Patent Document 1 focuses only on protecting the wafer from external impact, thereby not giving sufficient care for the surface of the wafer to be stored in the container. Specifically, the structure applied in the container described in Patent Document 1, in which the wafer is protected by being sandwiched between interlayer papers, is unable to cope with protection of the wafer surface that is provided with a cover glass on the surface of an image sensor or a 3DS-IC structure. Since the wafer surface has a significantly delicate structure due to the formation of micro-bumps, exposure of a TSV terminal and the like, contact with other members during storage or transport should be avoided for preventing contamination or scratches.

Further, the following are regarded as problems: rubbing the wafer with the members (the interlayer papers or the container itself) through direct contact; damages due to scratches, cracks, etc.; dust emission; and contamination to the wafer by chemical components. Therefore, keeping the wafer non-contact will be required. In some cases, the vertically-placed container capable of storing the plurality of wafers and used in a mass production process, has to be used. However, in the vertically-placed container, problems of storage space or transportation cost may arise due to a large container volume. Moreover, thin wafers may be damaged due to lack of a wafer keeping capability of the container.

The present invention intends to provide a semiconductor wafer container, which solves the above-described problems, formed by vertically overlapping two substantially flat and identical outer shells, which can accommodate a wafer in the manner that the upper and the bottom surfaces of the wafer do not substantially make contact with the outer shells.

Means for Solving the Problems

As a result of intensive studies to solve the above-described problems, the present inventors have found and completed the following present invention. In a semiconductor wafer container which accommodates a single semiconductor wafer by vertically overlapping two substantially flat and identical outer shells, an inclined surface, which is in line contact with the outer peripheral edge of the wafer from below, is formed on the upper surface of the outer shell constituting the container. A wafer contact surface, which is in surface contact with the outer peripheral edge of the wafer from above, is formed on the bottom surface of the outer shell. A shallow gap portion capable of covering either the upper half or the lower half of the wafer, is formed on each central region of both upper and bottom surfaces of the outer shell. When the semiconductor wafer is stored by vertically overlapping two outer shells, a hanging portion, which forms a closed external-wall at the outer side of the stored wafer, is formed on the outer peripheral edge of the bottom surface of the outer shell. Besides, when the wafer is stored by vertically overlapping two outer shells, the semiconductor wafer container can accommodate the wafer in the manner that the upper and the bottom surfaces of the wafer do not substantially make contact with the outer shells. Accordingly, even in a semiconductor wafer having circuits formed on both surfaces, contamination or scratches during storage or transport can be prevented. Further, contaminant or dust can be prevented from intruding into or adhering to the wafer container.

Accordingly, the present invention relates to the following.

[1] A semiconductor wafer container including two outer shells in a substantially flat and identical form, each outer shell vertically overlapping so as to accommodate a single semiconductor wafer therein, wherein the outer shell has a wafer retaining device and an external wall forming device in addition to a main body of the outer shell, wherein the wafer retaining device accommodates and fixedly holds the wafer in such a manner that upper and bottom surfaces of the wafer are not substantially in contact with the outer shells, the wafer retaining device including:

an inclined surface formed on an upper surface of the outer shell and being in line contact with an outer peripheral edge of the wafer from below; a wafer contact surface formed on a bottom surface of the outer shell and being in surface contact with the outer peripheral edge of the wafer from above; and a shallow gap portion formed on each central region of both the upper and bottom surfaces of the outer shell so as to cover an upper part or a lower part of the wafer; and wherein the external wall forming device has a hanging portion formed on an outer peripheral edge of the bottom surface of the outer shell so as to externally constitute a closed external wall relative to the wafer when each outer shell vertically overlaps to store the wafer.

[2] The semiconductor wafer container defined by [1], wherein the outer shell further has a positioning device, the positioning device being a boss and a boss hole engageable with each other and being provided on a surface of the outer shell in a position linearly symmetrical with a line crossing a center of the outer shell, and wherein the boss of one outer shell allows engagement with the boss hole of the other outer shell when each outer shell vertically overlaps.

[3] The semiconductor wafer container defined by [2], wherein the semiconductor wafer container has an external form to be plane-symmetrical with respect to the wafer accommodated in the container when each outer shell is vertically positioned and when an upper outer shell thereof is reversed upside down and overlaps a lower outer shell, and wherein the boss and the boss hole are arranged on each upper and bottom surface of the outer shell in which to allow engagement of the boss of one outer shell with the boss hole of the other outer shell when the upper outer shell is reversed upside down and overlaps the lower outer shell.

[4] The semiconductor wafer container defined by any one of [1] to [3], wherein each upper surface of the outer shells has four inclined surfaces equally spaced.

[5] The semiconductor wafer container defined by any one of [1] to [4], wherein a contact width at the wafer contact surface relative to the outer peripheral edge of the semiconductor wafer is within a range between 0.5 mm and 1.5 mm.

Effect of the Invention

According to the present invention, a semiconductor wafer container is provided, the container being able to accommodate a wafer in the manner that the upper and the bottom surfaces of the wafer do not substantially make contact with outer shells of the container, thereby preventing contamination or scratches during storage or transport even though a semiconductor wafer has circuits formed on both surfaces. Further, it is provided with a semiconductor wafer container formed by vertically overlapping two substantially flat and identical outer shells, which can prevent contaminant or dust from being intruded into or adhered to the container.

The semiconductor wafer container in the present invention can be advantageously used for protecting a semiconductor wafer surface having a significantly delicate structure due to the formation of micro-bumps or exposure of a TSV terminal during storage or transport. Examples of such wafer surfaces include the ones provided with a cover glass on the surface of an image sensor and a 3DS-IC structure.

The semiconductor wafer container in the present invention, in a preferred aspect, also comprises a boss and a boss hole as a positioning device. Further, the boss and the boss hole are arranged on each upper and bottom surface of the outer shell in which to allow engagement of the boss of one outer shell with the boss hole of the other outer shell when the upper outer shell is reversed upside down and overlaps the lower outer shell.

In the above semiconductor wafer container, the boss of one outer shell is adapted for engaging with the boss hole of the other outer shell so as to fix the wafer, only by turning the upper outer shell upside down and overlapping the lower outer shell without directly moving the wafer from the container. Accordingly, the semiconductor wafer container has a feature allowing operators to observe circuit-formed surfaces provided on both upper and bottom surfaces of the wafer.

In consequence, the above semiconductor wafer container enables inspection and observation of both upper and bottom surfaces of the wafer by means of handling of the container itself in automated facilities, while constantly keeping the wafer non-contact.

EMBODIMENTS CARRYING OUT THE PRESENT INVENTION

Figure 1:
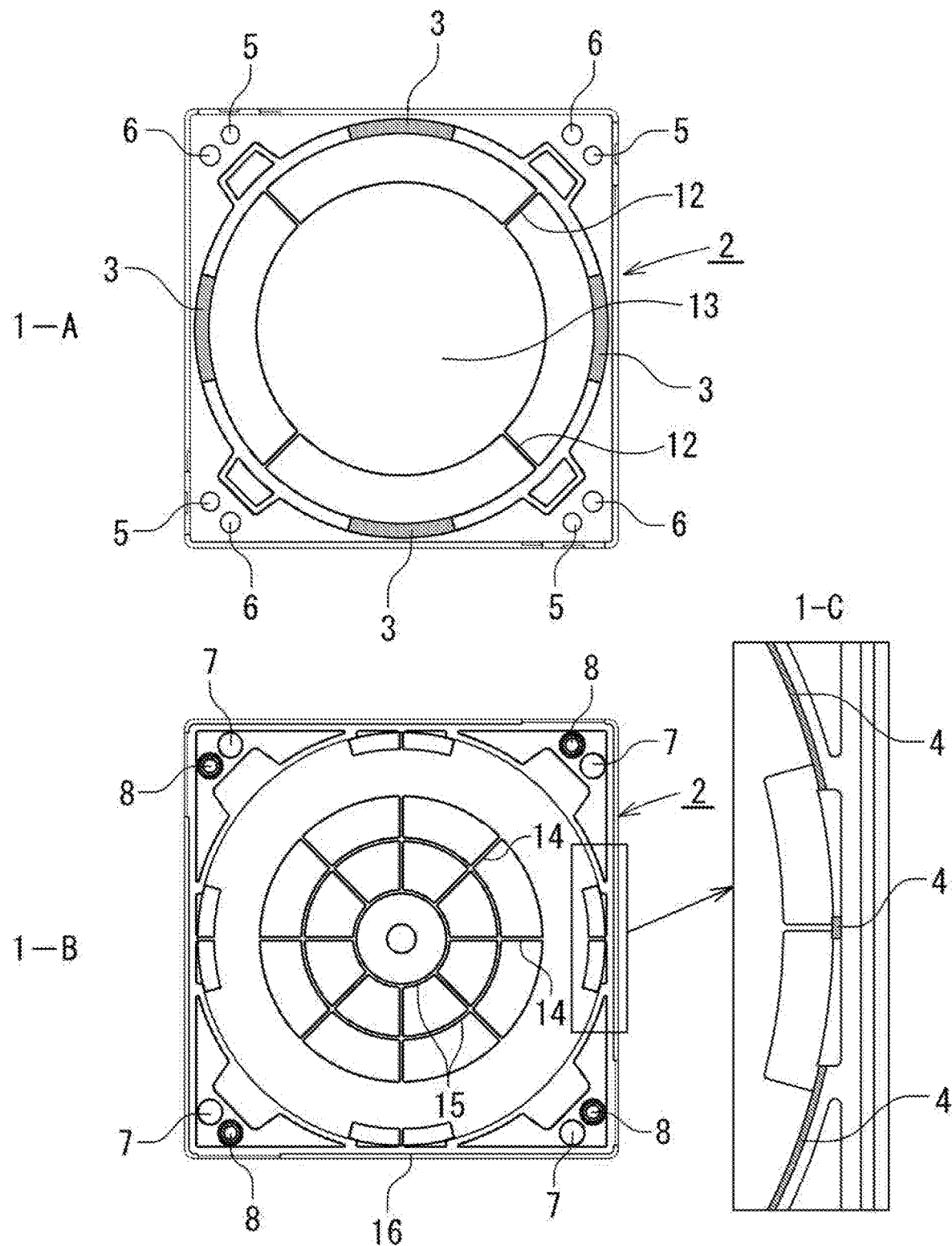
FIG. 1 shows the external views of the outer shell constituting the semiconductor wafer container of the present invention, while 1-A, 1-B and 1-C show the top view, the bottom view and the partially enlarged view of the bottom view, respectively.

The present invention relates to a semiconductor wafer container including two outer shells in a substantially flat and identical form, each outer shell vertically overlapping so as to accommodate a single semiconductor wafer therein, wherein the outer shell has a wafer retaining device and an external wall forming device in addition to a main body of the outer shell, wherein the wafer retaining device accommodates and fixedly holds the wafer in such a manner that upper and bottom surfaces of the wafer are not substantially in contact with the outer shells, the wafer retaining device including: an inclined surface formed on an upper surface of the outer shell and being in line contact with an outer peripheral edge of the wafer from below; a wafer contact surface formed on a bottom surface of the outer shell and being in surface contact with the outer peripheral edge of the wafer from above; and a shallow gap portion formed on each central region of both the upper and bottom surfaces of the outer shell so as to cover an upper part or a lower part of the wafer; and wherein the external wall forming device has a hanging portion formed on an outer peripheral edge of the bottom surface of the outer shell so as to externally constitute a closed external wall relative to the wafer when two outer shells vertically overlap to store the wafer.

Each outer shell constituting the semiconductor wafer container of the present invention can be produced by integrally molding a thermoplastic resin through, for example, injection molding, vacuum molding and pressure molding.

As the above thermoplastic resin, a polypropylene-based resin, a polystyrene-based resin, an ABS-based resin, a polycarbonate-based resin, a polyacetal-based resin, a polyphenylene-ether based resin, a polyether-nitrile based resin, a polyphenylene-sulfide based resin, a polyphthalamide-based resin, a polyarylate-based resin, a polysulfone-based resin, a polyether-sulfone based resin, a polyetherimide-based resin, a liquid-crystal polymer based resin, a polyether ether ketone based resin and the like can be given, and the polypropylene-based resin, the polycarbonate-based resin, etc. are preferred.

Further, the outer shell constituting the semiconductor wafer container of the present invention is preferred to be formed with a conductive thermoplastic resin provided with static electricity measures (antistatic thermoplastic resin). As the conductive thermoplastic resin, a thermoplastic resin added with a conductive filler, a thermoplastic resin treated by a polymer alloy, etc. can be given. As the conductive filler, carbon black, graphite carbon, graphite, carbon fiber, metal powder, metal fiber, metal oxide powder, metal-coated inorganic fine powder, organic fine powder or fiber and the like can be given. In terms of antistatics or transparency, it is effective to coat the surface with a conductive polymer such as polypyrrole or polyaniline.

The size of the semiconductor wafer that can be stored by the semiconductor wafer container of the present invention is not particularly limited, and nominal 5 inches, 6 inches, 8 inches, 12 inches, etc. can be given. The semiconductor wafer container of the present invention is formed in a size corresponding to the size of the semiconductor wafer.

The semiconductor wafer container of the present invention will now be described with reference to the drawings.

FIG. 1 shows the external views of an outer shell constituting the semiconductor wafer container of the present invention.

As shown in 1-A of FIG. 1, the upper surface of an outer shell 2 is substantially square, and equally spaced four inclined surfaces 3, which are in line contact with the outer peripheral edge of a semiconductor wafer from below, are formed on the upper surface. A bulge portion 13 is formed on a central region of the outer shell 2, and a rib-shaped projection 12 is extended from the bulge portion 13 toward a circumference of the outer shell 2. Further, a boss 5 and a boss hole 6 are formed on four corners of the upper surface of the outer shell 2.

As shown in 1-B of FIG. 1, the bottom surface of the outer shell 2 is also substantially square, and when the two outer shells 2, 2 vertically overlap, a hanging portion 16, which constitutes the external wall of the semiconductor wafer container, a radial rib-shaped projection 14 and a concentric rib-shaped projection 15 are formed on the bottom surface. Further, a boss 7 and a boss hole 8 are formed on four corners of the bottom surface of the outer shell 2.

Furthermore, as shown in 1-C, the partially enlarged view of 1-B, a wafer contact surface 4, which is in surface contact with the outer peripheral edge of the semiconductor wafer from above, is formed on the bottom surface of the outer shell 2.

Figure 2:
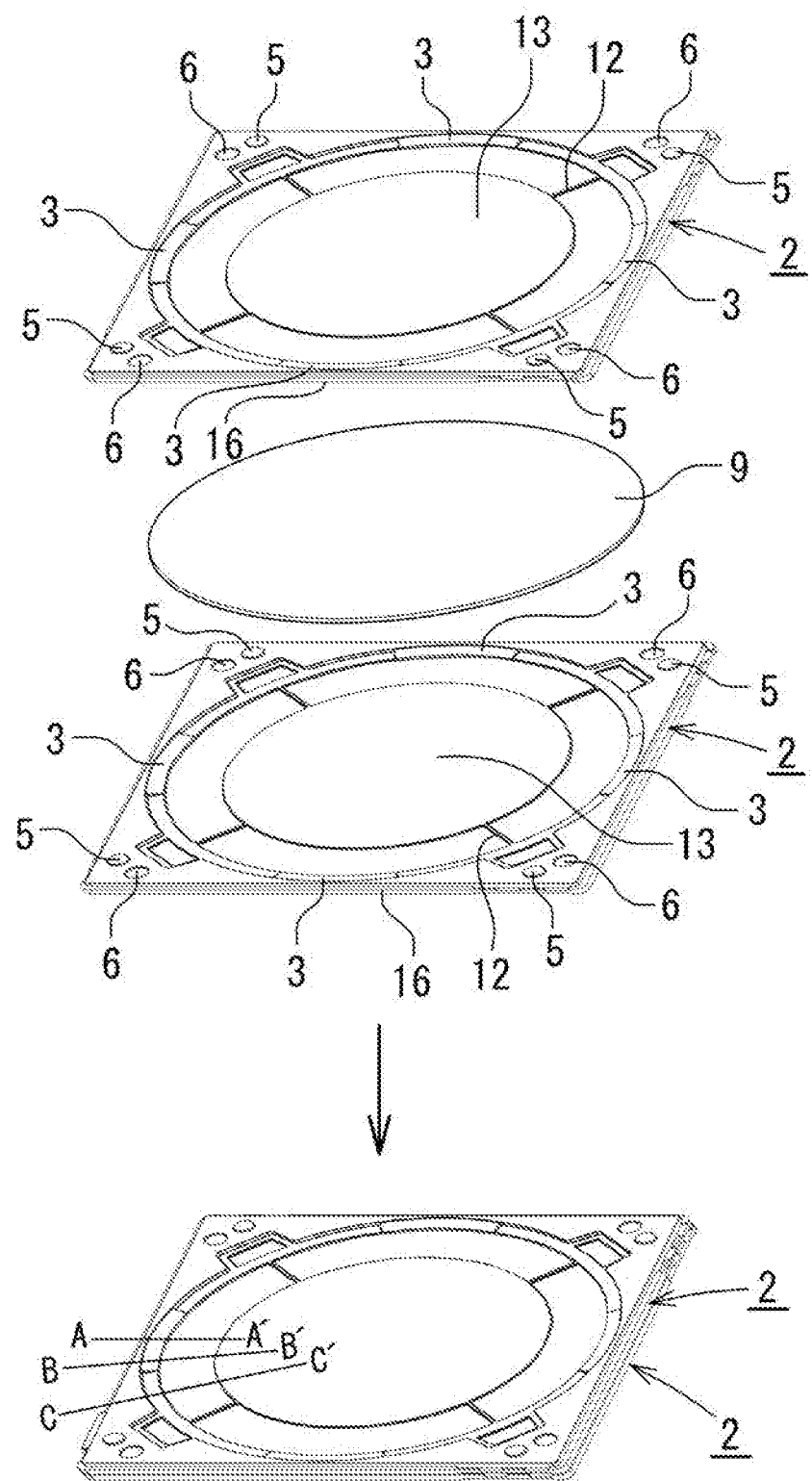
FIG. 2 shows the assembly view of the semiconductor wafer container of the present invention when a semiconductor wafer is stored by vertically overlapping the two outer shells.

FIG. 2 shows the assembly view of the semiconductor wafer container of the present invention when a semiconductor wafer 9 is accommodated by vertically overlapping the two outer shells 2, 2. In the semiconductor wafer container of the present invention as shown in FIG. 2, the semiconductor wafer 9 is pinched by which the two outer shells 2, 2 vertically overlap. The semiconductor wafer 9 is thus accommodated in the semiconductor wafer container.

Figure 3:
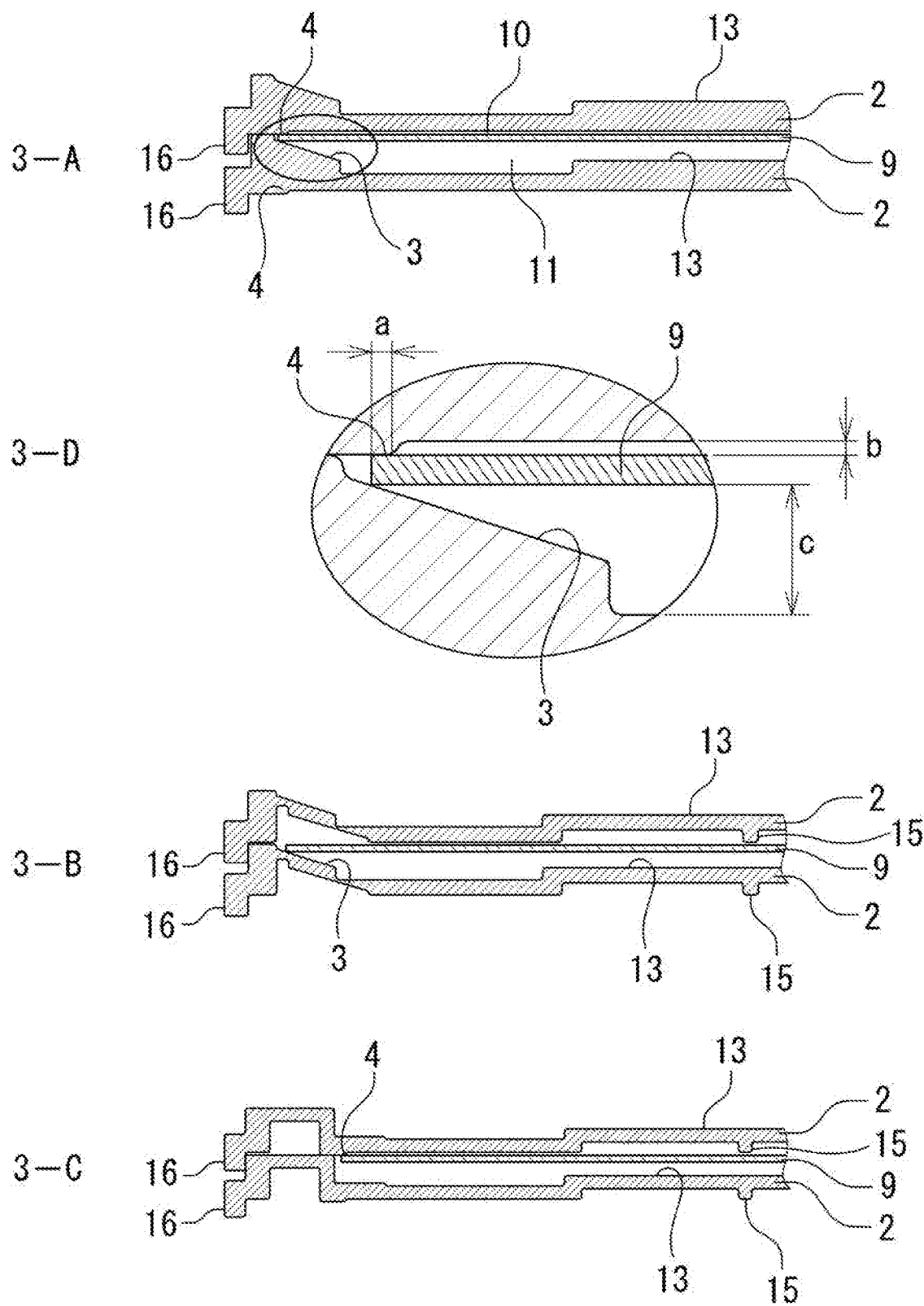
FIG. 3 shows the partial sectional views of the semiconductor wafer container of the present invention. 3-A shows the sectional shape when cut through at A-A' as shown in FIG. 2, while 3-B shows the sectional shape when cut through at B-B' as shown in FIG. 2. Further, 3-C shows the sectional shape when cut through at C-C' as shown in FIG. 2, and 3-D shows the partially enlarged view of 3-A.

3-A of FIG. 3 shows a sectional shape when cut through at A-A' as shown in FIG. 2. As shown in 3-A, the semiconductor wafer 9 is placed between the inclined surface 3 being in line contact with the outer peripheral edge of the semiconductor wafer 9 from below, and the wafer contact surface 4 being in surface contact with the outer peripheral edge of the semiconductor wafer 9 from above. Accordingly, a shallow gap portion 10 allowing storage of the upper part of the semiconductor wafer 9 and a shallow gap portion 11 allowing storage of the lower part of the semiconductor wafer 9 are formed. As a result, the semiconductor wafer 9 is accommodated and fixedly held in such a manner that the upper and bottom surfaces of the wafer are not substantially in contact with the outer shells.

Further, as shown in 3-D, the partially enlarged view of 3-A, the outer peripheral edge of the semiconductor wafer 9 is in surface contact with the wafer contact surface 4 from above, and a contact width a between the wafer contact surface 4 and the outer peripheral edge of the semiconductor wafer is preferably in the range of 0.5 mm to 1.5 mm. Furthermore, a distance b between the upper outer shell 2 and the semiconductor wafer 9, in the shallow gap portion 10 allowing storage of the upper part of the semiconductor wafer 9, is preferably in the range of 1.0 mm to 2.0 mm. Although a distance c between the lower outer shell 2 and the semiconductor wafer 9, in the shallow gap portion 11 allowing storage of the lower part of the semiconductor wafer 9, is preferably in the range of 4.0 mm to 5.0 mm, a distance at a portion where the bulge portion 13 is formed is preferably in the range of 2.0 mm to 3.0 mm.

Moreover, the hanging portion 16 is formed on the outer peripheral edge of the bottom surface of the outer shell 2, and a closed external wall is formed relative to the stored semiconductor wafer when the two outer shells vertically overlap.

3-B of FIG. 3 shows the sectional shape when cut through at B-B' as shown in FIG. 2. As defined by the sectional shape of 3-B, in the position cut through at B-B', the inclined surface 3 being in line contact with the outer peripheral edge of the semiconductor wafer 9 from below is formed, while the wafer contact surface 4 being in surface contact with the outer peripheral edge of the semiconductor wafer 9 from above is not formed.

3-C of FIG. 3 shows a sectional shape when cut through at C-C' as shown in FIG. 2. As defined by the sectional shape of 3-C, in a position cut through at C-C', the wafer contact surface 4 being in surface contact with the outer peripheral edge of the semiconductor wafer 9 from above is formed, while the inclined surface 3 being in line contact with the outer peripheral edge of the semiconductor wafer 9 from below is not formed.

As shown in 3-B and 3-C of FIG. 3, both of the inclined surface 3 and the wafer contact surface 4 are not formed along the entire outer peripheral edge of the semiconductor wafer 9, and hence there are some unformed portions. Such unformed portions may be used as insertion openings for arms of an automatic transfer apparatus when the semiconductor wafer 9 is inserted into or removed from the container, or a holding opening that operators can handle.

The semiconductor wafer container of the present invention has a boss and a boss hole as a positioning device. Further, the boss and the boss hole are arranged on each upper and bottom surface of the outer shell in which to allow engagement of the boss of one outer shell with the boss hole of the other outer shell when the upper outer shell is reversed upside down and overlaps the lower outer shell.

Figure 4:
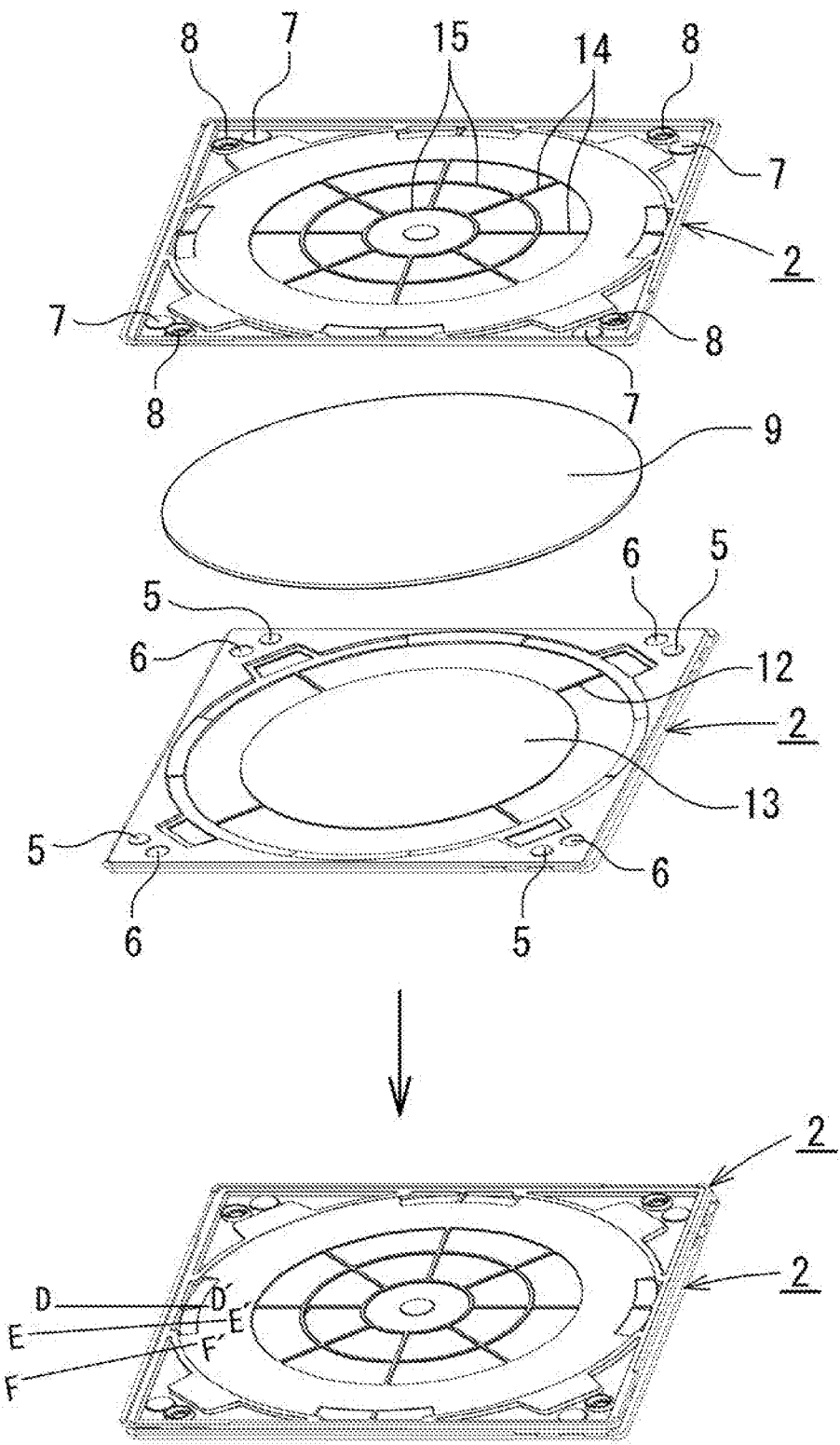
FIG. 4 shows the assembly view of the semiconductor wafer container of the present invention where the upper outer shell is reversed upside down and overlaps the lower outer shell so as to store the semiconductor wafer.

FIG. 4 shows the assembly view of the semiconductor wafer container of the present invention. In the view, the upper outer shell between the two outer shells is reversed upside down and vertically overlaps the lower outer shell so as to store the semiconductor wafer.

Note that the semiconductor wafer 9 is pinched and accommodated between the upper outer shell 2 reversed upside down and the lower outer shell 2 not reversed upside down.

Figure 5:
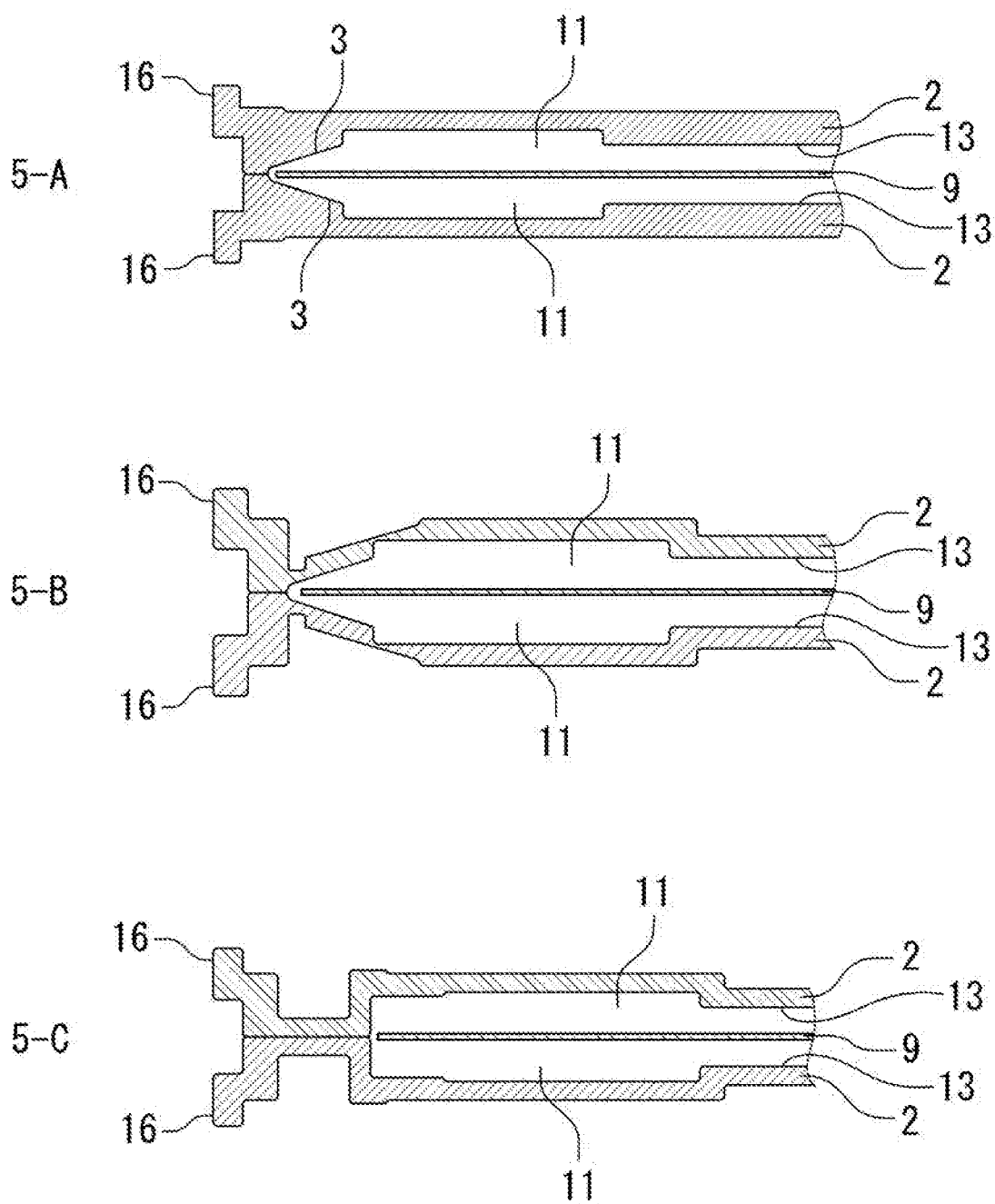
FIG. 5 shows the partial sectional views of the semiconductor wafer container of the present invention where the upper outer shell is reversed upside down and overlaps the lower outer shell so as to store the semiconductor wafer. 5-A shows the sectional shape when cut through at D-D' as shown in FIG. 4, while 5-B shows the sectional shape when cut through at E-E' as shown in FIG. 4. Further, 5-C shows the sectional shape when cut through at F-F' as shown in FIG. 4.

5-A of FIG. 5 shows a sectional shape when cut through at D-D' in FIG. 4. As shown in 5-A, the semiconductor wafer 9 is held between the inclined surfaces 3,3 formed on the lower outer shell 2 and the inclined surface 3 formed on the upper outer shell 2. With this structure, the upper and the bottom surfaces of the semiconductor wafer 9 are fixed in line contact with the inclined surfaces 3, 3 of the outer shells. In this case, the shallow gap portions 11, 11 are each formed at the upper side and the bottom side of the semiconductor wafer 9. This allows operators possibly to observe the circuit-formed surfaces formed on both upper and bottom surfaces of the semiconductor wafer 9. Note that the above retention and fixation of the semiconductor wafer 9 will be conducted by which each outer edge of both surfaces of the semiconductor wafer 9 is only in line contact with the inclined surface 3. Accordingly, the above may not be sufficient if the semiconductor wafer 9 should be transported.

In the above case where the outer shells 2, 2 overlap, the hanging portion 16 formed on the outer peripheral edge of the bottom surface of the outer shell 2 does not constitute an external wall.

5-B of FIG. 5 shows a sectional shape when cut through at E-E' in FIG. 4. As defined by the sectional shape of 5-B, as the same with the sectional shape cut through at D-D', also in the sectional shape cut through at E-E', the semiconductor wafer 9 is pinched and fixed between the inclined surface 3 formed on the lower outer shell 2 and the inclined surface 3 formed on the upper outer shell 2.

5-C of FIG. 5 shows a sectional shape when cut through at F-F' in FIG. 4. As defined by the sectional shape of 5-C, in the position cut through at F-F', both of the upper and the lower outer shells 2, 2 do not constitute the inclined surface 3 making line contact with the outer peripheral edge of the semiconductor wafer 9.

Assembly as shown in FIG. 4 enables operators to inspect and observe both upper and bottom surfaces of the wafer by handling containers themselves in automated facilities, while constantly keeping the wafer non-contact. Supposing that the semiconductor wafer 9 is to be transported, the above assembly structure cannot fully avoid damages such as scratches or cracks.

The semiconductor wafer container of the present invention has the boss and the boss hole as the positioning device, the boss and the boss hole being engageable with each other and being provided on the surface of the outer shell in a position linearly symmetrical with a line crossing the center of the outer shell. Further, the boss of one outer shell can engage with the boss hole of the other outer shell when the two outer shells vertically overlap.

Figure 6:
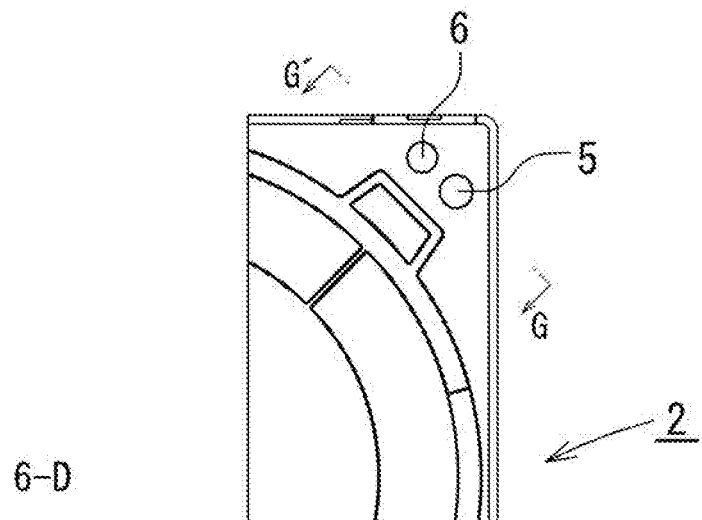
FIG. 6 shows the partial sectional view 6-D of the semiconductor wafer container of the present invention. 6-A shows the sectional shape where a single outer shell is cut through at G-G', while 6-B shows the sectional shape where the two outer shells vertically overlapping are cut through at G-G'. Further, 6-C shows the sectional shape where the two outer shells, in which the upper outer shell is reversed upside down and overlaps the lower outer shell, are cut through at G-G'.
Figure 6:
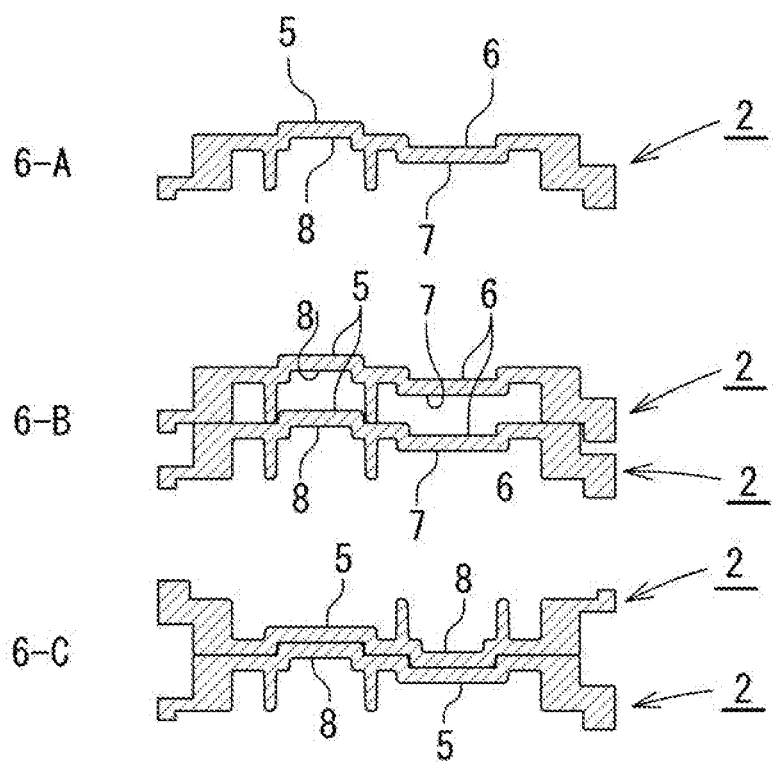

FIG. 6 shows the partial sectional view of the outer shell constituting the semiconductor wafer container of the present invention where the boss 5 and the boss hole 6 are cut through at G-G'.

In FIG. 6, 6-A shows the sectional shape where the single outer shell 2 is cut through at G-G', 6-B shows the sectional shape where the two outer shells 2, 2 vertically overlap and are cut through at G-G', and 6-C shows the sectional shape where the two outer shells 2, 2 are cut through at G-G', the upper outer shell thereof being reversed upside down and overlapping the lower outer shell.

As shown in 6-A, the rear portion where the boss 5 is formed has the boss hole 8 while the rear portion where the boss hole 6 is formed has the boss 7.

Figure 7:
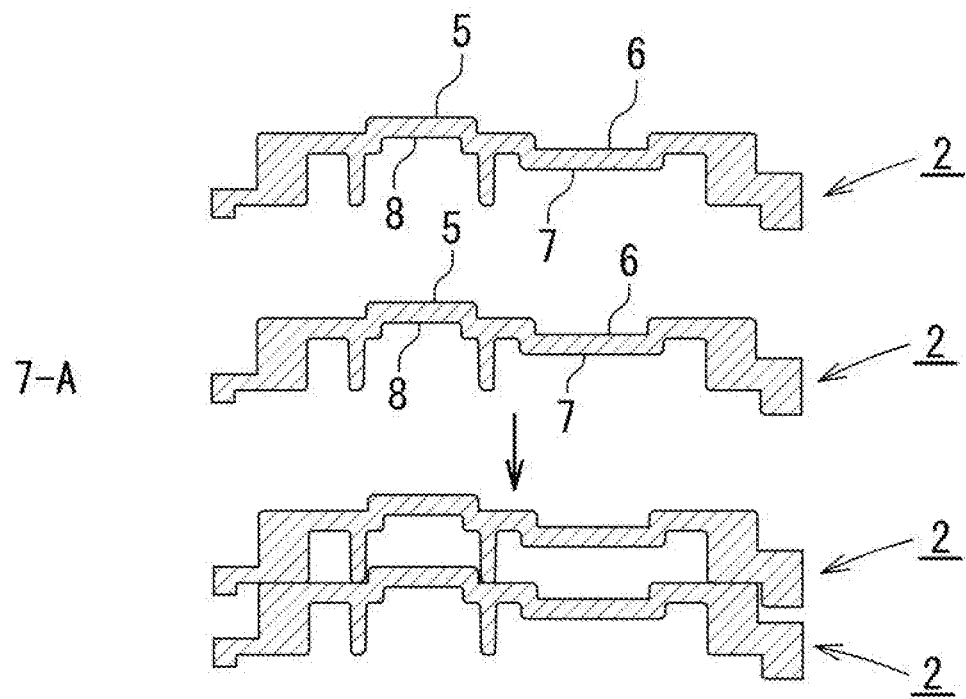
FIG. 7 shows the explanatory views of the engaging condition where a boss engages with a boss hole in the semiconductor wafer container of the present invention. 7-A shows the engaging condition of the boss and the boss hole in which the two outer shells vertically overlap, while 7-B shows the engaging condition of the boss and the boss hole in which the upper outer shell is reversed upside down and overlaps the lower outer shell.
Figure 7:
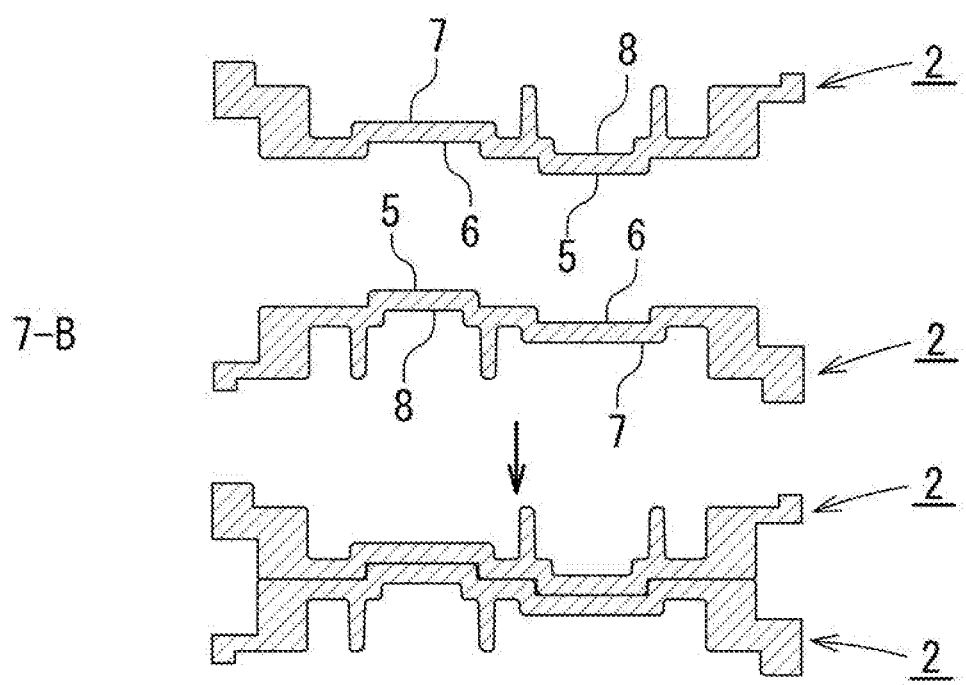

The engaging condition where the two outer shells 2, 2 vertically overlap as shown in 6-B is explained by 7-A of FIG. 7. Specifically, as shown in 7-A, when the two outer shells 2, 2 vertically overlap in the same face, the boss hole 8 of the upper outer shell 2 is adapted to engage with the boss 5 of the lower outer shell 2. The positioning will be done by this manner.

Further, the engaging condition of 6-C, in which only the upper outer shell 2 of the two outer shells 2, 2 is reversed upside down and vertically overlaps the lower outer shell 2, is explained by 7-B of FIG. 7. Specifically, as shown in 7-B, when only the upper outer shell 2 of the two outer shells 2, 2 is reversed upside down and vertically overlaps the lower outer shell 2, the boss hole 6 of the upper outer shell 2 engages with the boss 5 of the lower outer shell 2. In addition, the boss 5 of the upper outer shell 2 engages with the boss hole 6 of the lower outer shell 2. The positioning will be done by this manner.

In the semiconductor wafer container of the present invention, it is preferable to have a fastener that can connect the two outer shells for not being separated from each other during transportation. Further, it is also preferable that the fastener can be easily removed after the transportation.

The fastener should not be specified as long as the above purpose can be achieved.

The wafer container in the present invention provides a semiconductor wafer container including two outer shells in a substantially flat and identical form, each outer shell vertically overlapping. Since the semiconductor wafer container has the above structure, the upper and the bottom surfaces of a wafer can be accommodated substantially in a non-contact manner. Accordingly, even if circuits are formed on both surfaces of the semiconductor wafer, it is possible to prevent the wafer from being contaminated or scratched during storage or transport. Further, this will also prevent contaminant or dust from being intruded into or adhered to the wafer container.

The semiconductor wafer container in the present invention can be advantageously used for protecting a semiconductor wafer surface having a significantly delicate structure due to the formation of micro-bumps or exposure of a TSV terminal during storage or transport. Examples of such wafer surfaces include a cover glass on the surface of an image sensor and a 3DS-IC structure.

In addition to the above, considering the semiconductor wafer container in the present invention, between the two outer shells, only the upper outer shell is reversed upside down and overlaps the lower outer shell so as to store the semiconductor wafer. This provides a feature in which to allow observation of circuit-formed surfaces formed on both upper and bottom surfaces of the wafer.

Moreover, in the semiconductor wafer container of the present invention, since the two identically formed outer shells vertically overlap in the same face, it allows each container to be vertically set. Because of this, a plurality of semiconductor wafers can be concurrently stored and transported.

EXAMPLE

Next, the present invention will be further defined based on an example. The present invention should not be limited to the example.

Example 1

By using plastic pellets with antistatic properties, in which 15 parts by weight of antistatic agent was added into 100 parts by weight of polycarbonate resin, a transparent outer shell having an outer appearance shown in FIG. 1 was produced through injection molding. The outer shell has a platy shape which is approximately squared and has a side length of 32 cm, the outer shell being able to store a semiconductor wafer with 300 mm in diameter. The outer shell has a thickness of 2 mm along almost the entire body thereof. Note that, in order not to produce distortion on the platy surface of the outer shell, the followings should be considered: the rib-shaped projection 12 (width: 2 mm, height/thickness: 2 mm); the bulge portion 13 (a disc-shaped bulge with height/thickness: 2 mm and diameter: 21 cm); the radial rib-shaped projection 14 (width: 2 mm, height/thickness: 2 mm); the concentric rib-shaped projection 15 (width: 2 mm, height/thickness: 2 mm); and the like.

The two outer shells formed in the above manner were vertically set in the same face so as to accommodate the semiconductor wafer with 300 mm in diameter. Through this, the followings should be noted: the contact width a between the wafer contact surface 4 and the outer peripheral edge of the semiconductor wafer is 1.0 mm on average; the distance b between the upper outer shell and the semiconductor wafer in the shallow gap portion 10 allowing storage of the upper part of the semiconductor wafer is 1.5 mm; the distance c between the lower outer shell and the semiconductor wafer in the shallow gap portion 11 allowing storage of the lower part of the wafer is 4.0 mm; and a distance between the portion where the bulge portion 13 is formed and the wafer is 2.0 mm.

The container obtained is transparent so that operators are able to see through conditions how the wafers are stored. In addition, the obtained container not only has sufficient strength as a wafer storage container when used in a vertical or horizontal direction but also it has dust-proof properties. Further, even though the container has been used for a long period of time, almost no torsion was found. Still further, even though two or more containers were vertically set, stable setting of those containers was possible. To an extent that some shock was given to corners of the container when handling it, the wafers stored in the container were not damaged.

Lastly, when only the upper outer shell, between the two outer shells formed above, was reversed upside down and vertically overlapped the lower outer shell so as to store a semiconductor wafer with 300 mm in diameter, the operators were able to inspect and observe both upper and bottom surfaces of the wafer while keeping it non-contact.

EXPLANATION OF THE REFERENCES

2: outer shell
3: inclined surface
4: wafer contact surface
5: boss
6: boss hole
7: boss
8: boss hole
9: semiconductor wafer
10: shallow gap portion (enable to store the upper part of a semiconductor wafer)
11: shallow gap portion (enable to store the lower part of a semiconductor wafer)
12: rib-shaped projection
13: bulge portion
14: radial rib-shaped projection
15: concentric rib-shaped projection
16: hanging portion

The invention claimed is:

1. A semiconductor wafer container including two outer shells in a substantially flat and identical form, each outer shell vertically overlapping so as to accommodate a single semiconductor wafer therein,
wherein each outer shell has a main body, a wafer retaining device and an external wall forming device,
wherein the wafer retaining device accommodates and fixedly holds the wafer in such a manner that upper and bottom surfaces of the wafer are not substantially in contact with the outer shells, the wafer retaining device including: an inclined surface formed on an upper surface of the outer shell and being in line contact with an outer peripheral edge of the wafer from below; a wafer contact surface formed on a bottom surface of the outer shell and being in surface contact with the outer peripheral edge of the wafer from above; and a shallow gap portion formed on each central region of both the upper and bottom surfaces of the outer shell so as to cover an upper part or a lower part of the wafer,
wherein the external wall forming device has a hanging portion formed on an outer peripheral edge of the bottom surface of the outer shell so as to externally constitute a closed external wall relative to the wafer when each outer shell vertically overlaps to store the wafer, wherein the outer shell further has a positioning device, the positioning device being a boss and a boss hole engageable with each other and being provided on a surface of the outer shell in a position linearly symmetrical with a line crossing a center of the outer shell, wherein the boss of one outer shell allows engagement with the boss hole of the other outer shell when each outer shell vertically overlaps, wherein the semiconductor wafer container has an external form to be plane-symmetrical with respect to the wafer accommodated in the container when each outer shell is vertically positioned and when an upper outer shell thereof is reversed upside down and overlaps a lower outer shell, and wherein the boss and the boss hole are arranged on each upper and bottom surface of the outer shell in which to allow engagement of the boss of one outer shell with the boss hole of the other outer shell when the upper outer shell is reversed upside down and overlaps the lower outer shell.

2. The semiconductor wafer container according to claim 1, wherein each upper surface of the outer shells has four inclined surfaces equally spaced.

3. The semiconductor wafer container according to claim 1, wherein a contact width at the wafer contact surface relative to the outer peripheral edge of the semiconductor wafer is within a range of 0.5 mm and 1.5 mm.

4. The semiconductor wafer container according to claim 3, wherein a contact width at the wafer contact surface relative to the outer peripheral edge of the semiconductor wafer is within a range of 0.5 mm and 1.5 mm.

* * * * *

UNITED STATES PATENT AND TRADEMARK OFFICE
CERTIFICATE OF CORRECTION

PATENT NO. : 11,121,013 B2
APPLICATION NO. : 16/498450
DATED : September 14, 2021
INVENTOR(S) : Masayuki Nishijima et al.

It is certified that error appears in the above-identified patent and that said Letters Patent is hereby corrected as shown below:

On the Title Page

Item (30), change "JP2017-071320" to --2017-071320--.

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*